United States Patent
Saito

(10) Patent No.: US 8,490,796 B2
(45) Date of Patent: Jul. 23, 2013

(54) PROBE CARD CONTAINER WITH ROLLERS

(75) Inventor: Morihiro Saito, Tokyo (JP)

(73) Assignee: Kyodo Co., Ltd., Tokyo (JP)

( * ) Notice: Subject to any disclaimer, the term of this patent is extended or adjusted under 35 U.S.C. 154(b) by 0 days.

(21) Appl. No.: 13/304,166

(22) Filed: Nov. 23, 2011

(65) Prior Publication Data

US 2013/0056390 A1    Mar. 7, 2013

(30) Foreign Application Priority Data

Sep. 1, 2011 (JP) ................. 2011-005135

(51) Int. Cl.
*B65D 85/00* (2006.01)
*A45C 5/14* (2006.01)

(52) U.S. Cl.
USPC ..................... 206/725; 190/18 A

(58) Field of Classification Search
USPC ................. 206/701–728; 190/18 A
See application file for complete search history.

(56) References Cited

U.S. PATENT DOCUMENTS

| 5,695,068 | A  | * | 12/1997 | Hart et al.     | 206/725 |
| 6,561,328 | B1 | * | 5/2003  | Huang           | 190/18 A |
| 7,871,505 | B2 | * | 1/2011  | Nemoto et al.   | 206/709 |
| 2009/0289050 | A1 | * | 11/2009 | Ondricek     | 206/710 |

FOREIGN PATENT DOCUMENTS

| JP | 58-155804   | 9/1983  |
| JP | 4-89020     | 8/1992  |
| JP | 07-285604   | 10/1995 |
| JP | 3023840     | 4/1996  |
| JP | 3035519     | 12/1996 |
| JP | 11-127935   | 5/1999  |
| JP | 2004-170267 | 6/2004  |
| JP | 2009-107638 | 5/2009  |
| JP | 3171687     | 5/2012  |

* cited by examiner

*Primary Examiner* — Bryon Gehman

(74) *Attorney, Agent, or Firm* — Dicke, Billig & Czaja, PLLC

(57) ABSTRACT

A probe card container having a main case consisting of upper and lower case portions for storing therein a prove card, a handle provided on one side surface of the main case, one or more members for preventing the movement of the main case provided on a mounting surface of the main case, and one or more rollers for assisting the movement of the main case provided on the mounting surface or a corner formed between the mounting surface and the other side surface of the main case so as to project obliquely downward from the corner.

6 Claims, 7 Drawing Sheets

PROBE CARD CONTAINER WITH ROLLERS

FIELD OF THE INVENTION

The present invention relates to a container for a probe card, such as a jig for inspecting a semiconductor wafer, and more particularly, relates to a probe card container which is moved hardly by an oscillation or a shock in case that the container is rested on an exclusive shelf. The present invention relates further to a probe card container which can be moved easily by a smaller force less than a half of force required for moving the container normally. According to the present invention a thin probe card container can be realized.

BACKGROUND OF THE INVENTION

FIG. 11 is a plan view of a conventional probe card container, FIG. 12 is a cross sectional side view at the line of A-A of FIG. 11, and FIG. 13 is a plan view of the conventional probe card container of FIG. 11 with an upper case portion being removed.

In FIG. 11 to FIG. 13, a reference numeral 1 denotes a main case made of duralumin of the conventional probe card container consisting of a box-like lower case portion 2 with an open upper surface for receiving therein a probe card, and of an upper case portion 3 for closing selectively the open upper surface of the lower case portion 2.

A reference numeral 4 denotes a probe card, 5 denotes a hinge provided on right side (one side) surfaces of the lower and upper case portions 2 and 3 for connecting together the lower and upper case portions 2 and 3. A reference numeral 6 denotes a fixing member for fixing the probe card 4 stored in the lower case portion 2, 7a and 7b denote locking elements provided on left side (other side) surfaces of the lower and upper case portions 2 and 3, respectively.

Reference numerals 8a and 8b denote handles provided on the left side (other side) surfaces (opposite side of the hinge) of the lower and upper case portions 2 and 3, respectively.

In the above conventional probe card container, the probe card 4 is inserted into the lower case portion 2 and fixed to the lower case portion 2 by fixing member 6, the lower case portion 2 is covered with the upper case portion 3, and the lower and upper case portions 2 and 3 are connected together by the lock elements 7a and 7b.

The probe card container having therein the probe card 4 is normally rested on an exclusive shelf, and taken out from the shelf by hand of the operator when the probe card is to be used.

Recently, there is a tendency of increasing the diameter of the probe card, because the silicon wafer is increased in diameter, and accordingly the probe card container is also increased in dimension. The probe card container including therein a probe card is increased in weight more than 20 kg and it is over the limit to handle by human faculty.

Further, it is dangerous to handle the probe card container rested on the exclusive shelf by the operator, because such shelf is located normally at a high position and liable to oscillate unexpectedly. Accordingly, an exclusive device for handling to take out the probe card container rested on the exclusive shelf is required.

Accordingly, there is such a task that the probe card container can be rested on and taken out of the exclusive shelf, and moved on a rest table easily, safely and precisely by hand of the operator.

Further, it is required that the probe card container having therein an expensive and precise probe card, rested on the exclusive shelf or the like is not moved easily by the oscillation or shock. Still further, it is required to prevent the oscillation of the exclusive shelf or the table for supporting the probe case container from being transmitted to the probe card stored in the container.

SUMMARY OF THE INVENTION

An object of the present invention is to provide a probe card container which is simple in structure, can be moved easily by a smaller force less than a half of the force required normally to move the probe card container and can not be moved if it is necessary. Further object of the present invention is to provide a thin probe card container.

Still further object of the present invention is to provide a probe card container characterized by comprising a main case consisting of upper and lower case portions for storing therein a probe card, a handle provided on one side surface of the main case, and one or more rollers for assisting the movement of the main case and one or more members for preventing the movement of the main case, the roller and the member being provided on a mounting surface of the main case.

Yet further object of present invention is to provide a probe card container characterized by comprising a main case consisting of upper and lower case portions for storing therein a probe card, a handle provided on one side surface of the main case, one or more members for preventing the movement of the main case provided on a mounting surface of the main case, and one or more rollers for assisting the movement of the main case provided on a corner formed between the mounting surface and the one side surface of the main case so as to project obliquely downward from the corner.

In the probe card container of the present invention, the mounting surface of the main case is a bottom surface of the lower case portion.

In the probe card container of the present invention, the member is projected from the mounting surface of the main case at a position between the handle and the roller and adjacent to the roller, the projection length of the member being larger than that of the roller.

In the probe card container of the present invention, the member is compatible to an oscillation absorber.

The probe card container of the present invention is not moved easily by the oscillation or shock in case that the container is rested on the exclusive shelf, the supporting surface or the floor, because the member for preventing the movement of the container is provided on the mounting surface of the container, to be supported by the supporting surface.

Further, because the roller is provide on the mounting surface of the container, or on the corner portion, the container can be moved easily in the forward, backward, right and left directions by a smaller force less than a half of the force required normally to move the container on the exclusive shelf or the like, if the handle is lifted so that the container is inclined centering around the roller and the member for preventing the movement of the container is separated from the supporting surface for supporting the contain while contacting the roller with the supporting surface. That is, the heavy container can be moved easily by the hand of the operator safely and precisely.

In case that the roller for assisting the movement of the main case is provided on the corner formed between the mounting surface and the one surface of the main case so as to project obliquely downward from the corner, a distance between the bottom surface of the container and the lower end of the roller can be reduced, and thus a distance between the bottom surface of the container and the lower end of the member can be reduced, so that a thin container can be realized.

Further, in case that the member for preventing the movement of the container is compatible to an oscillation absorber, the oscillation and shock applied from the outside can be absorbed by the member of the probe card container, so that the oscillation and shock applied from the outside to the probe card stored in the container can be reduced.

These and other aspects and objects of the present invention will be better appreciated and understood when considered in conjunction with the following description and the accompanying drawings. It should be understood, however, that the following description, while indicating preferred embodiments of the present invention, is given by way of illustration and not of limitation. Many changes and modifications may be made within the scope of the present invention without departing from the spirit thereof, and the invention includes all such modifications.

DESCRIPTION OF THE PREFERRED EMBODIMENTS

Embodiments of a probe card container according to the present invention will be explained with reference to the drawings.

Figure 9:
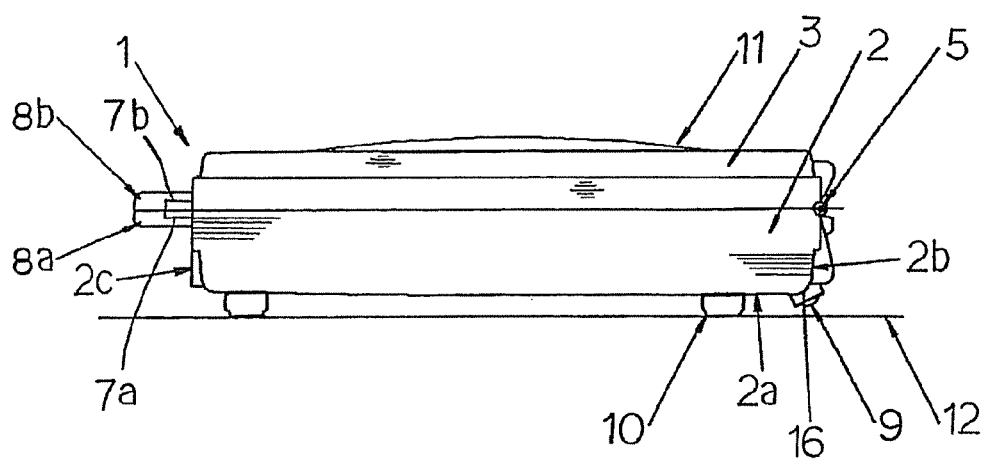
FIG. 9 is a front view of a probe card container of a second embodiment according to the present invention.
Figure 10:
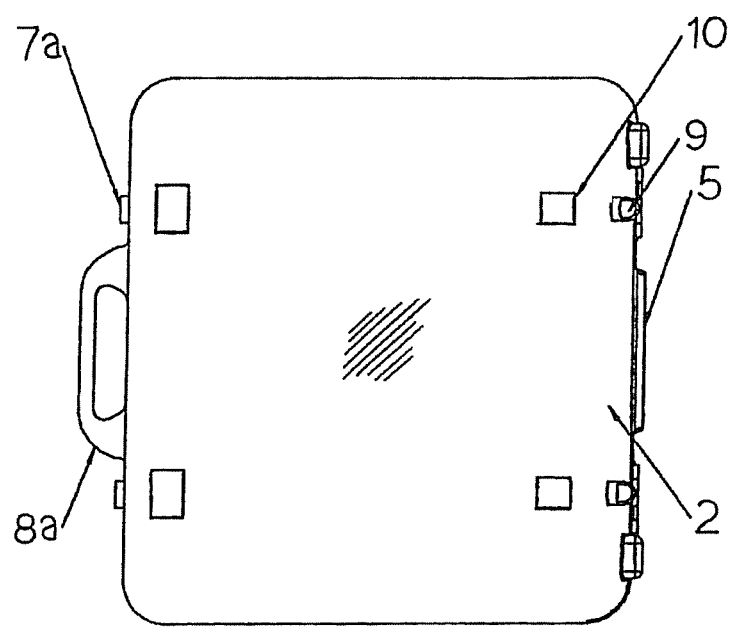
FIG. 10 is a bottom view of the probe card container of the second embodiment according to the present invention.
Figure 11:
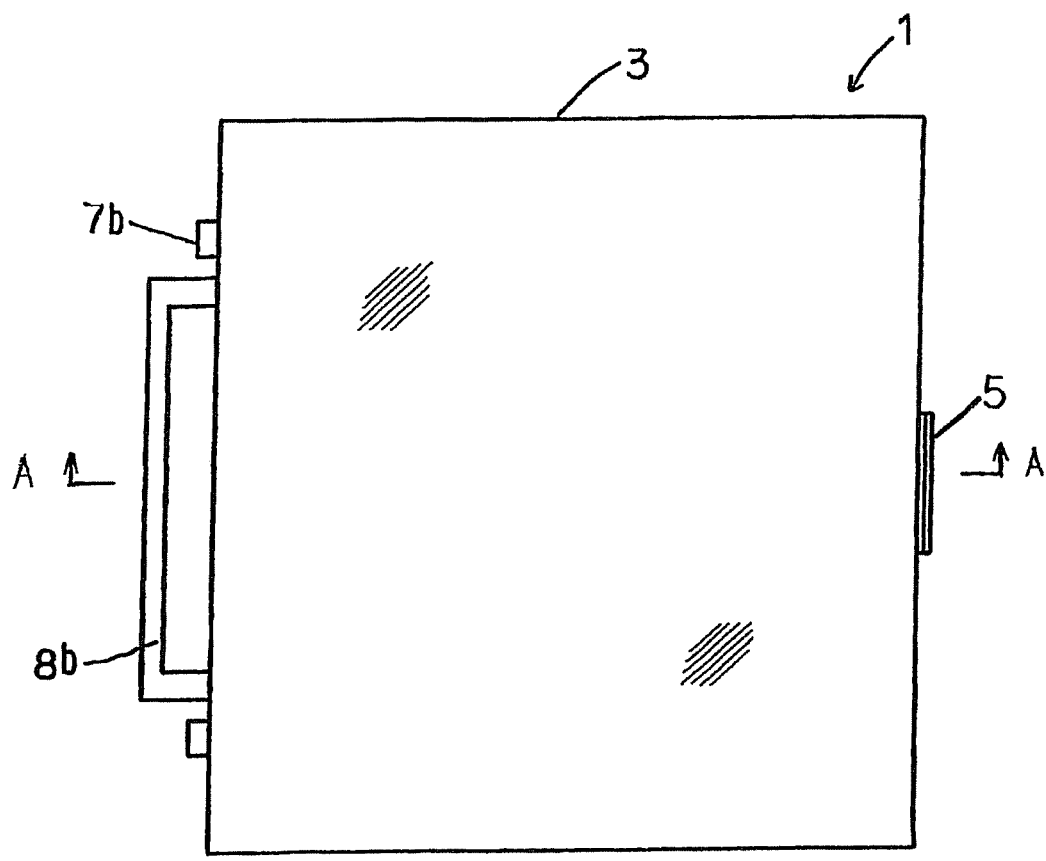
FIG. 11 is a plan view of a conventional probe card container.
Figure 12:
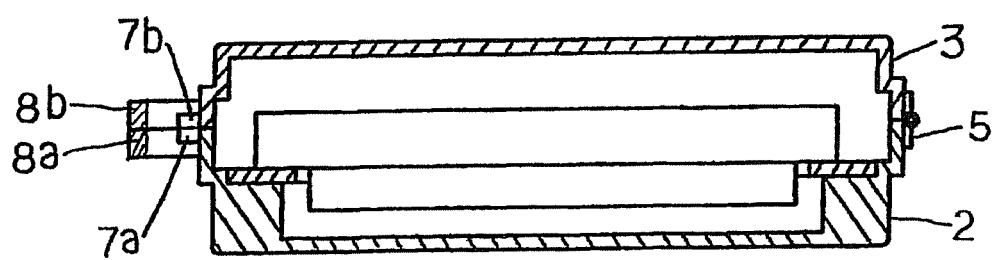
FIG. 12 vertical sectional front view taken along line A-A of FIG. 11.
Figure 13:
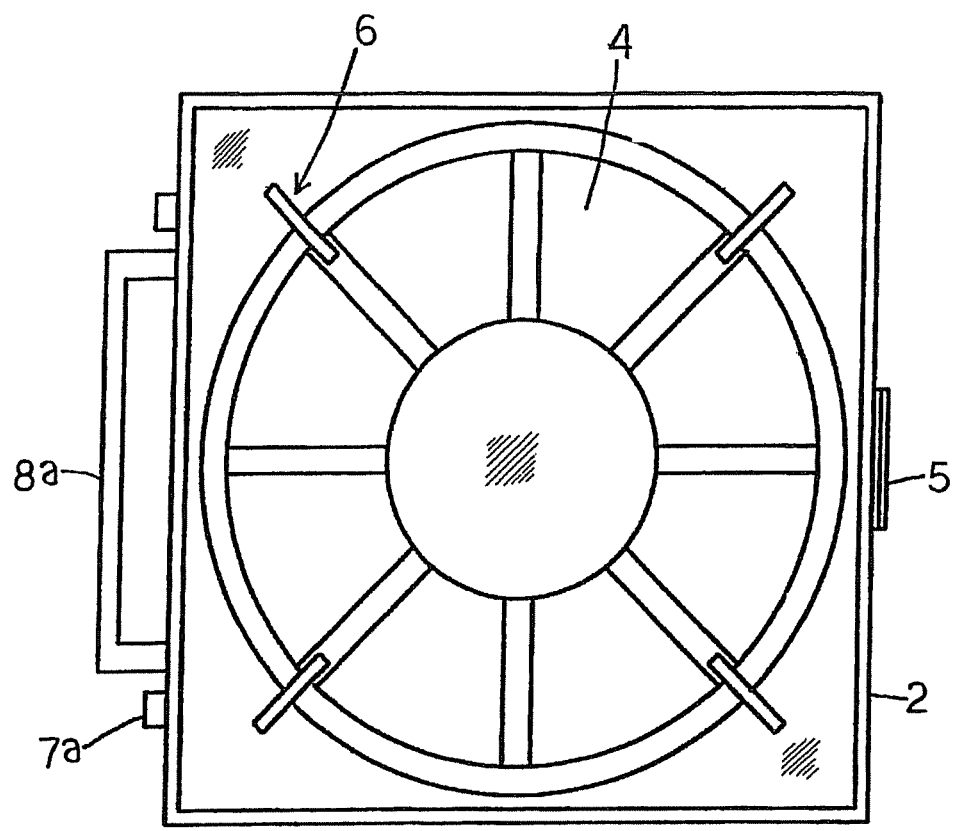
FIG. 13 is a plan view of the probe card container shown in FIG. 11 with an upper case portion being removed.

In FIG. 1 to FIG. 10, parts of the probe card container which are similar to corresponding parts of the probe card container shown in FIG. 11 to FIG. 13 have been given corresponding reference numbers and need not be further redescribed.

Embodiment 1

Figure 1:
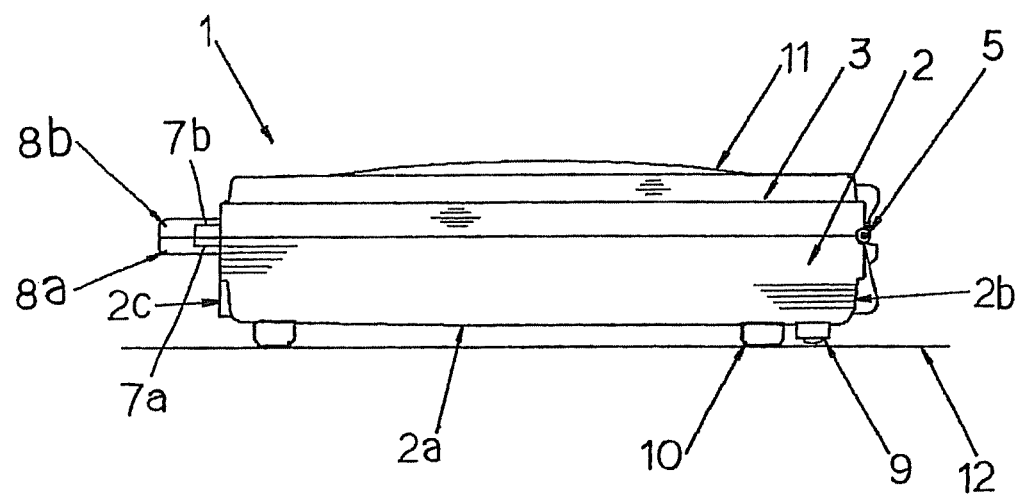
FIG. 1 is a front view of a probe card container of a first embodiment according to the present invention.
Figure 2:
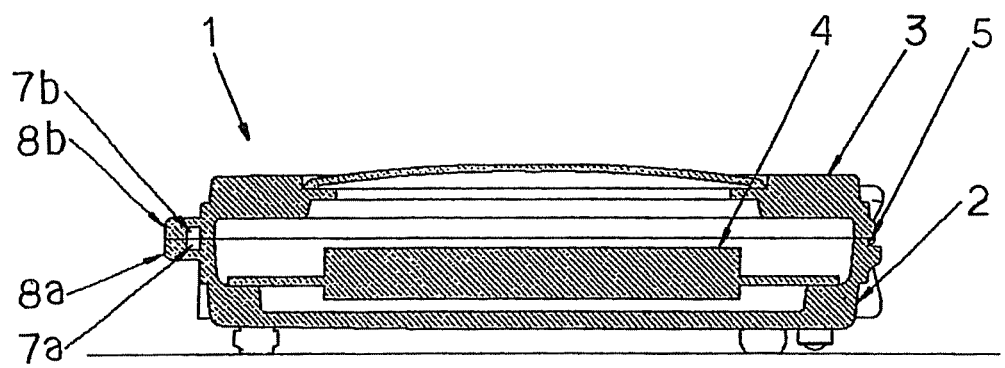
FIG. 2 is a vertical sectional front view of the probe card container shown in FIG. 1.
Figure 3:
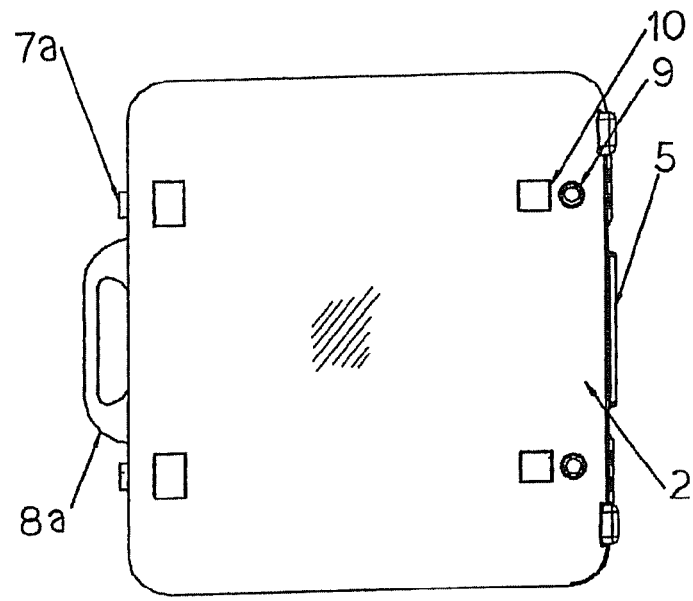
FIG. 3 is a bottom view of the probe card container shown in FIG. 1.

In a first embodiment of the present invention, a main case 1 of a probe card container is made of resins, and as shown in FIG. 1 to FIG. 3, one or more rollers 9 for assisting the movement of the main case 1 in directions of forward, backward, rightward and leftward are provided on a bottom surface 2a of the main case 1, at a position adjacent to a right side surface (one side surface 2b).

The roller 9 is projected downward from the bottom surface 2a by 20 mm, for example. The main case 1 is formed of a lower case portion 2 with an open upper surface for receiving therein a probe card 4 and of upper case portion 3 for closing the open upper surface of the lower case portion 2.

Handles 8a and 8b are provided on a left side surface (other side surfaces 2c) of the main case 1.

Further, a member 10 for preventing the movement of the main case 1 is provided at a position between the handle 8a and the roller 9 on the bottom surface 2a of the lower case portion 2 to be supported by a supporting surface 12.

The member 10 is made of oscillation absorbing materials, such as rubbers, and projected downward from the bottom surface 2a by 25 mm, for example, so that the projected end of the member 10 becomes lower a little than the project end of the roller 9.

A reference numeral 11 denotes a transparent or semitransparent circular window formed on a ceiling portion of the upper case portion 3, through which the probe card 4 etc. stored in the lower case portion 2 can be recognized.

The probe card container according to the first embodiment of the present invention is prevented from being moved easily by the oscillation or shock in case that the container is rested on the exclusive shelf, floor or the supporting surface 12, because the member 10 for preventing the movement of the main case 1 is provided.

Further, the oscillation and shock from the shelf etc. for supporting the probe card container are absorbed by the member 10 compatible to an oscillation absorber, so that the oscillation and shock are not transmitted to the probe card 4 stored in the container.

Figure 4:
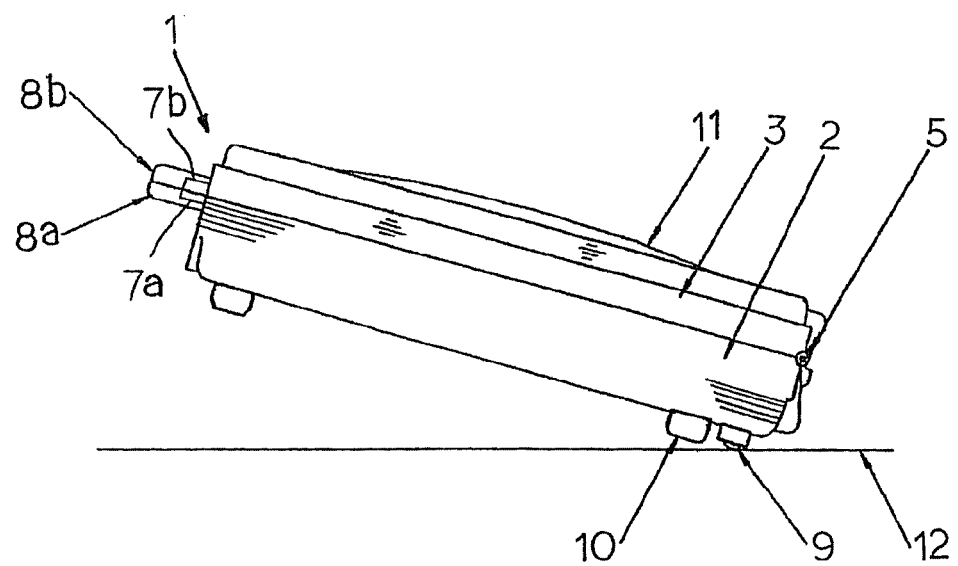
FIG. 4 is an explanatory view of the probe card container of the first embodiment of the present invention in the moving state.

Further, the probe card container according to the present invention can be moved easily and precisely with safe by a smaller force less than a half of force required normally to move the container on an exclusive shelf or the like, if the handles 8a and 8b are lifted so that the container is inclined and the member 10 for preventing the movement of the container is separated from the supporting surface 12 while contacting the roller 9 with the supporting surface 12, as shown in FIG. 4.

Figure 5:
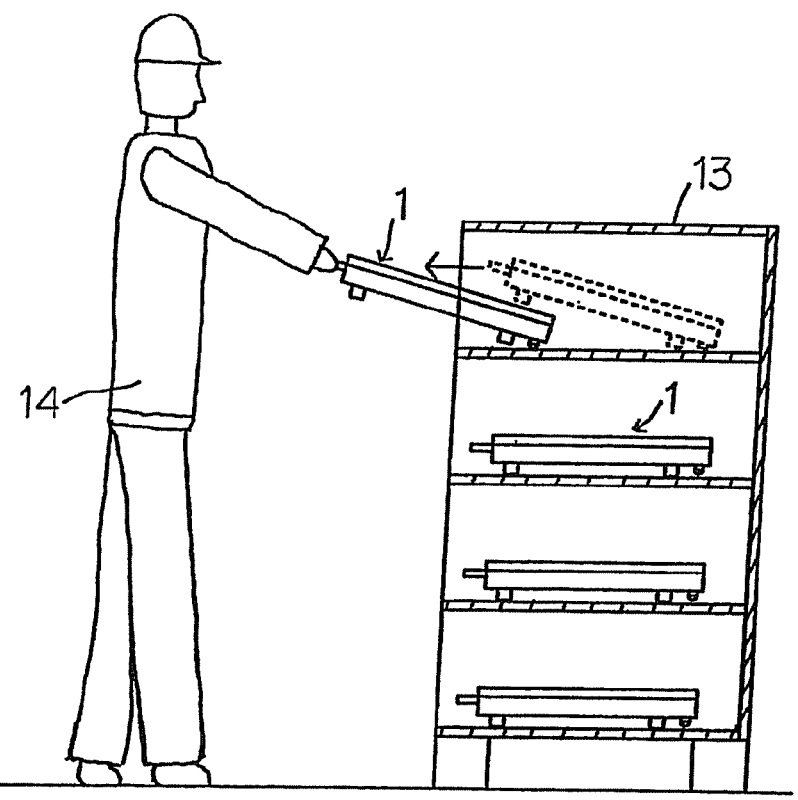
FIG. 5 is an explanatory view of the probe card container of the first embodiment of the present invention in the moving state.
Figure 6:
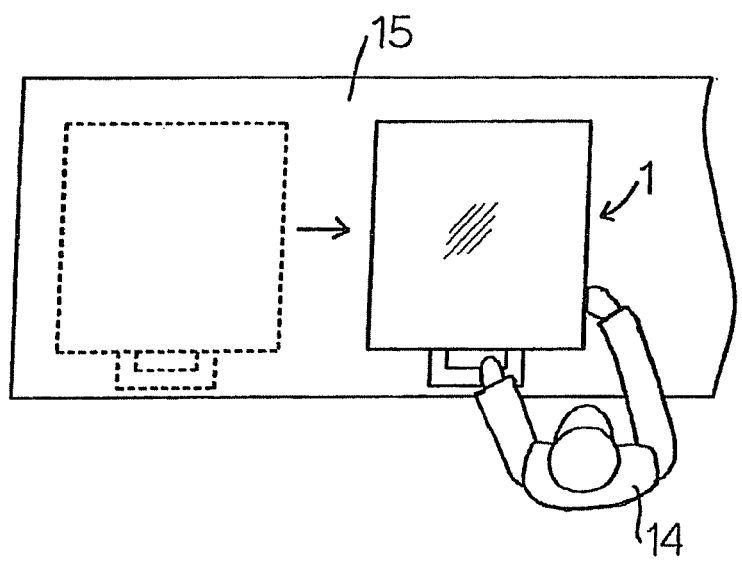
FIG. 6 is an explanatory view of the probe card container of the first embodiment of the present invention in the other moving state.

In FIG. 5, a reference numeral 13 denotes an exclusive shelf, and 14 denotes an operator. The main case 1 of the probe card container is inclined by lifting the handle of the main case 1 and pulled to forward by the operator 14. In FIG. 6, a reference numeral 15 denotes a rest table for the probe card container. The main case 1 of the probe card container is inclined by lifting the handle of the main case 1 and moved to rightward by the operator 14.

Figure 7:
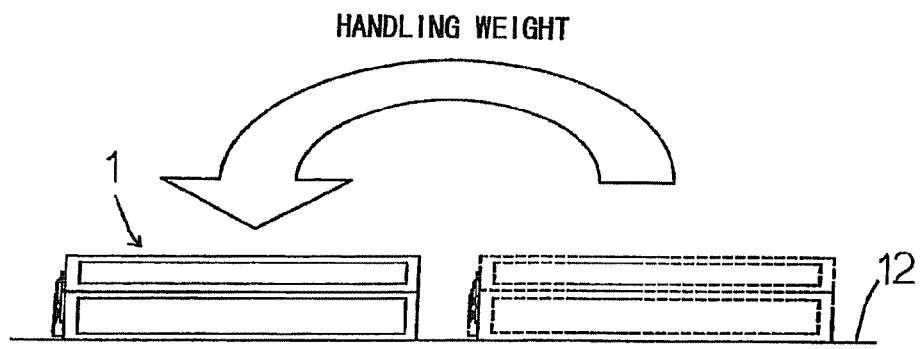
FIG. 7 is an explanatory view of a handling load required for handling the conventional probe card container.
Figure 8:
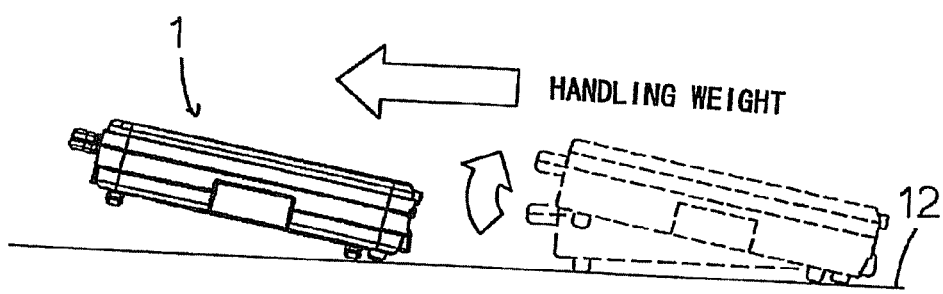
FIG. 8 is an explanatory view of a handling load applied to the probe card container for moving the container according to the first embodiment of the present invention.

A TABLE 1 shows a comparison test of a handling weight required to move the conventional duralumin case including a probe card (weight is 19.3 kg) as shown in FIG. 7 and of a handling weight required to move the resin case of the present invention including a probe card (weight is 17.8 kg) as shown in FIG. 8.

TABLE 1

| No. | test case | weight of case (kg) | weight of test case (including a probe card) | handling weight (kg) |
|---|---|---|---|---|
| 1 | conventional duralumin case | 6.8 | 19.3 | 19.3 |
| 2 | resin case of the present invention | 5.3 | 17.8 | 8 |

As apparent from the TABLE 1, in case of the conventional duralumin case including a probe card, a handling weight of 19.3 kg is necessary to move the case, because it is necessary to lift the duralumin case entirely, whereas in case of the resin case of the present invention a handling weight of only 8 kg is necessary, because the resin case is moved by tilting the resin case centering around the roller 9 and pulling to rightward the resin case.

According to the present invention, the probe card container can be moved by smaller force than the force required conventionally.

As stated above, the conventional probe card container can not be pulled forward or moved sideward, if the handling force is smaller than the weight of the container, whereas in the present invention, the container can be pulled forward or moved sideward by the handling force smaller than a half of the force required conventionally. Thus, the probe card container of the present invention can be moved very easily, safely and precisely.

Accordingly to the present invention, a probe card container is simple in structure, possible to move easily by a force smaller than a half of the force required conventionally and can be stopped according to the necessity. Further, as the roller 9 for assisting the movement of the main case 1, a spherical or cylindrical rotary member, such as bearings and casters can be used. The roller 9 movable only one direction, such as forward or backward direction may be used. In the embodiment of the present invention, one or more rollers 9 for assisting the movement of the container may be used, and one or more members 10 for preventing the movement of the container may be used.

Embodiment 2

In a second embodiment of the present invention, the roller 9 for assisting the movement of the container is provided obliquely downward, for example, at an angle of 45° with respect to the bottom surface 2a of the main case 1 on a corner portion 16 formed between the bottom surface 2a and the right side surface 2b of the main case, as shown in FIG. 9 and FIG. 10.

According to the second embodiment of the present invention, a distance between the lower end of the roller 9 and the bottom surface 2a can be reduced, and thus a distance between the lower end of the member 10 and the bottom surface 2a can be reduced, so that a thin container can be realized.

While the invention has been particularly shown and described with reference to the preferred embodiments thereof, it will be understood by those skilled in the art that various changes in form and details may be made therein without departing from the spirit and scope of the invention as defined by the appended claims.

What is claimed is:

1. A probe card container comprising;
    a main case for storing therein a probe card, wherein the main case has a mounting surface;
    a handle provided on one side surface of the main case;
    one or more rollers for assisting the movement of the main case, wherein the one or more rollers are provided on the mounting surface of the main case; and
    one or more members for preventing the movement of the main case and for absorbing oscillation of the main case, the one or more rollers, the one or more members being provided on a mounting surface of the main case at a position between the handle and the one or more rollers and adjacent to the one or more rollers, wherein a projection length of the one or more members is larger than a projection length of the one or more rollers.

2. The probe card container as claimed in claim 1, wherein the mounting surface of the main case is a bottom surface of the main case.

3. The probe card container as claimed in 1, wherein the main case consists of upper and lower case portions.

4. A probe card container comprising:
    a main case for storing therein a probe card, wherein the main case has a mounting surface;
    a handle provided on one side surface of the main case;
    one or more members for preventing the movement of the main case and for absorbing oscillation of the main case provided on the mounting surface of the main case; and
    one or more rollers for assisting the movement of the main case provided on a corner formed between the mounting surface and the one side surface of the main case so as to project obliquely downward from the corner, wherein the one or more members are projected from the mounting surface of the main case at a position between the handle and the one or more rollers and adjacent to the one or more rollers and wherein a projection length of the one or more members is larger than a length of the one or more rollers.

5. The probe card container as claimed in claim 4, wherein the mounting surface of the main case is a bottom surface of the main case.

6. The probe card container as claimed in 4, wherein the main case consists of upper and lower case portions.

* * * * *